(12) United States Patent
Yeomans

(10) Patent No.: US 6,220,241 B1
(45) Date of Patent: Apr. 24, 2001

(54) BUOYANT PLATFORM FOR RADIANT ENERGY COLLECTING APPARATUS

(76) Inventor: Allan J. Yeomans, 60 Sunrise Boulevard, Surfers Paradise, Queensland 4217 (AU)

( * ) Notice: Subject to any disclaimer, the term of this patent is extended or adjusted under 35 U.S.C. 154(b) by 0 days.

(21) Appl. No.: 09/263,759

(22) Filed: Mar. 5, 1999

(30) Foreign Application Priority Data

Mar. 10, 1998 (AU) ................................................. PP 2226

(51) Int. Cl.[7] ...................................................... F24J 2/42
(52) U.S. Cl. ...................... 126/565; 126/568; 126/600; 126/690; 126/696
(58) Field of Search ................................... 126/561–568, 126/694, 693, 695, 684, 686, 681

(56) References Cited

U.S. PATENT DOCUMENTS 4,090,496 * 5/1978 Mallet ................................... 126/565
5,309,893 * 5/1994 Yeomans ............................... 126/565

FOREIGN PATENT DOCUMENTS

994106 * 11/1951 (FR) ..................................... 126/565
800515 * 1/1981 (SU) ..................................... 126/565

* cited by examiner

Primary Examiner—James C. Yeung
(74) Attorney, Agent, or Firm—Wood, Phillips, VanSanten, Clark & Mortimer

(57) ABSTRACT

Radiant energy collecting apparatus (11) which includes a platform assembly (13) floating on a body of liquid, the top side of which supports reflectors (16) of a solar concentrator and the underside of which is provided with a series of compartments (31) which are open on their lowermost sides and which contain air to provide buoyant lift to maintain the reflectors (16) above the level of liquid. Air may be supplied to the compartments (31) through an air duct (33) beneath the platform assembly (13), the duct (33) having a number of openings (35) through which the air passes.

21 Claims, 6 Drawing Sheets

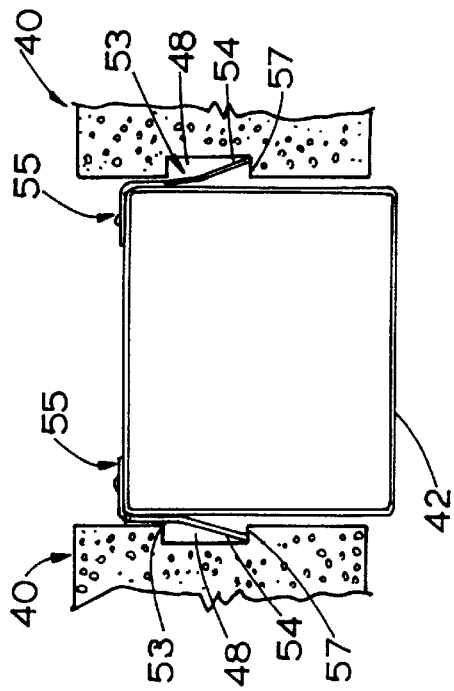
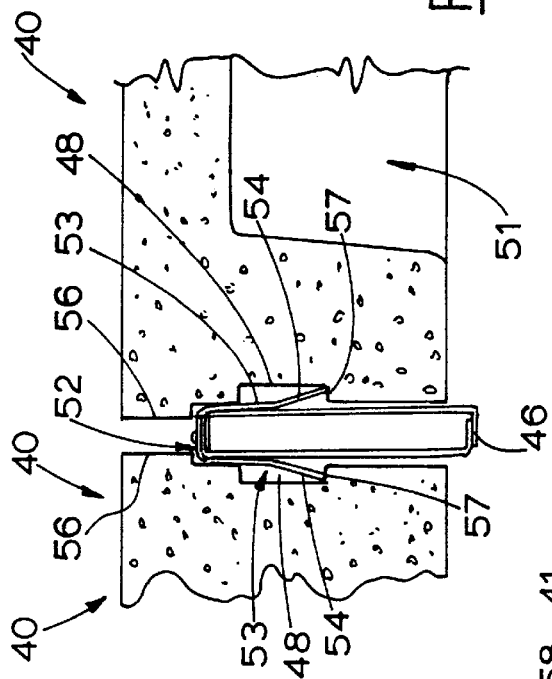
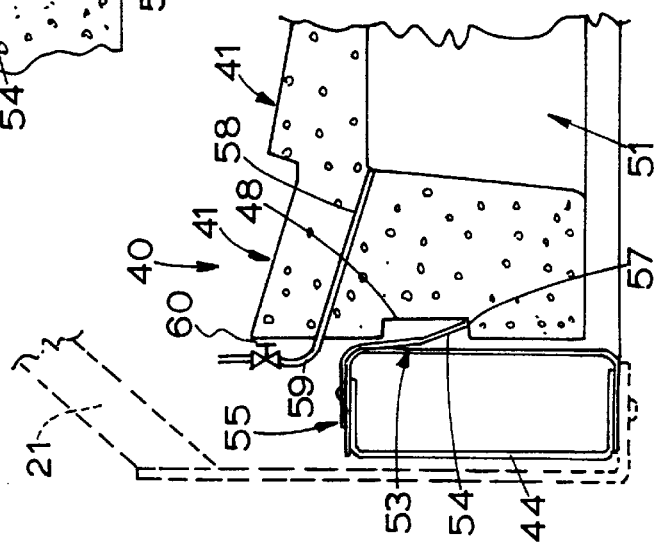

BUOYANT PLATFORM FOR RADIANT ENERGY COLLECTING APPARATUS

TECHNICAL FIELD

This invention relates to radiant energy collecting apparatus of the type in which the radiant energy concentrators and/or collectors are supported to float on a body of liquid and which may be moved on the body of liquid to track movement of the sun.

BACKGROUND ART

In my U.S. Pat. Nos. 5,309,893 and 5,592,932, the contents of which are incorporated herein by reference. I disclose radiant energy collecting apparatus for collecting and concentrating radiant solar energy from the sun. In that apparatus, the solar energy concentrators comprise a plurality of strip mirrors which are arranged along a parabolic curve to define a composite parabolic trough. The mirrors are supported on a buoyant body which may be rotated to follow the sun during the course of the day so as to ensure efficient energy concentration. The buoyant body also support solar energy collectors for collecting the solar energy concentrated by the solar energy concentrators.

SUMMARY OF THE INVENTION

The present invention aims provide a method and means for buoyantly supporting solar energy collecting apparatus on a body of fluid which will be reliable and efficient in use. The present invention in a preferred aspect aims to provide an arrangement which enables the buoyancy of the buoyant support means to be maintained or enhanced if a loss of buoyancy occurs. Other objects and advantages of the invention will become apparent from the following description.

The present invention thus provides in one aspect radiant energy collecting apparatus including solar energy collecting means, platform means for supporting said solar energy collecting means on a body of liquid, compartment means on the underside said platform means for containing air and providing buoyant lift to said platform means, said compartment means being open on their lowermost side.

The compartment means suitably comprises a plurality of individual compartments. Preferably, the compartments are arranged at spaced locations on the underside of the platform means.

In one form, the compartments may comprise compartments formed integrally with the platform means. In another form, the compartments may comprise separate hollow bodies attached to the underside of the platform means. In yet a further form, the compartments may be fabricated and attached to the underside of the platform means. The compartments may also comprise any combination of the above arrangements.

When integrally formed with the platform means, the compartments may be defined by a plurality of downwardly extending ribs or flanges on the underside of the platform means, the ribs or flanges defining the sides of the compartments with the base thereof being defined by the undersurface of the platform means. The ribs or flanges may be of many different configurations to form the compartments. For example, the compartments may be of circular, square, hexagonal or of any other cross sectional shape. In one form, the ribs or flanges may comprise a first series of substantially parallel ribs or flanges extending across the platform means and a second series of intersecting ribs or flanges extending substantially at right angles to the first series of ribs or flanges.

Whilst preferably formed integrally with the platform means, the ribs or flanges may also be attached to the underside of the platform means and for this purpose may be of an interlocking construction. Suitable sealing may be used where required to make the compartments air tight, particularly at the junction of the intersecting ribs or flanges and their attachment to the platform means.

The use of ribs or flanges on the underside of the platform means also increases the stiffness and strength of the platform means permitting it to be constructed of a lighter weight material or of less thickness.

When the compartments are separate hollow bodies, they may be in the form of hollow rectangular or square bodies of for example bucket-like form which are inverted and attached or held to the underside of the platform means.

If desired the buoyant platform means may comprise a combination of integrally formed compartments and separate bodies. Some of the bodies may be located within the integrally formed compartments which may have a similar configuration internally to the external configuration of the hollow bodies.

The platform means in one form may include in one form on its upper surface, a series of mounts for reflectors such as mirrors which define solar concentrating means. The reflector mounts may be in the form of surfaces which are angled at increasing angle to the horizontal so that reflectors mounted thereon form a composite parabolic trough to concentrate solar energy on a target arranged at or adjacent a focus line or lines of the parabolic trough. The reflectors are suitably in the form of thin elongate strip mirrors of glass or other reflective material such as a polished metal.

The reflector mounts on the platform means may be formed such that a pair of platform means may be arranged adjacent but opposite to each other in end-to-end relationship to form the composite parabolic trough. Thus the reflector mounts in this configuration have an increasing angle to the horizontal outwardly of the centre of the trough. A series of opposite such platform means may be arranged in this configuration and connected to or by a suitable frame. Typically eight such platform means may be provided in an array of two columns by four rows. The frame which in use is supported by the floating platform means suitable may serve as a support for a target or solar energy receiver of any form. The frame may include frame members around the periphery of respective platform means. Preferably the platform means include grooves in their periphery and connection members on the frame members extend into said grooves and are supported on shoulders therein.

In a further form, the upper surface of the platform means may provide a mount for photovoltaic cells. For this purpose, the platform means may include on its upper surface a plurality of surfaces angled at the mean declination of the sun which varies according to the latitude of operation. Typically, the surfaces may be angled at 20°–70° to the horizontal. Alternatively, the cells may be mounted on a separate member such as a planar member mounted at a set or adjustable angle to the platform means.

The platform means in one configuration is formed of a plastics material with both the compartments and reflector or cell mounts or surfaces formed integrally on opposite sides of the platform means. The platform means however may be formed of other materials such as metal for example aluminium. In yet an alternative form, the platform means may be fabricated for example of glass reinforced plastics or moulded from glass reinforced plastics or any other moldable material such as concrete. The concrete may comprise a light-weight concrete incorporating for example a light-weight material such as foam plastic beads.

To ensure that the platform means retains it buoyancy, means may be provided to supply air to the compartments. In one form the air supply means may comprise an air supply hose or duct located beneath the compartments. Air supplied through the hose thus will form bubbles of air in the liquid which bubbles will rise upwardly to supply air to the compartments and displace liquid therefrom. Suitably the hose or duct is provided with a series of openings at longitudinally spaced positions to permit escape of air therethrough. Excessive air will simply pass to the outer extremities of the buoyant platform means or will spill from one compartment to the next. The platform means are suitably arranged in an interconnected array for rotation around a vertical axis with the parabolic troughs (or photo-voltaic cell mounts) aligned with or parallel to each other. The array as a whole may be rotated on the body of liquid about the vertical axis to follow the sun.

Most preferably, the hose or duct is arranged to extend diametrically relative to the axis of rotation of the platform means or array of platform means. This ensures that during one full day when the platform means are rotated through approximately 180° to follow the sun, each platform means will be successively passed over the hose or duct and be exposed to the air bubbles so that the compartments thereof will be successively charged with air.

The air supply means hose may be connected to any suitable pump which may be operated as required or at set intervals to supply air through the hose or duct to the compartments.

The present invention thus provides in a further aspect solar energy collecting apparatus including a solar energy collector, platform means for supporting said solar energy collector on a body of liquid, compartment means on the underside said platform means for containing air and providing buoyant lift to said platform means, said compartment means being open on their lowermost side, and means for selectively supplying air to said compartments.

In yet a further aspect, the present invention provides a method of buoyantly supporting solar energy collecting apparatus on a body of liquid, said method including the steps of providing platform means having a plurality of air compartments on its underside for buoyantly supporting said solar energy collecting apparatus, and selectively supplying air to said compartments to maintain the buoyancy of said platform means to normally maintain said collecting apparatus above the level of liquid.

The platform means may also includes means to enable it to be submerged in inclement weather conditions for example hail to protect the reflectors or cells from damage. For this purpose, means for releasing from the compartments may be provided. Such means may include passages connected to each compartment and a valve or valves connected to or in the passages to allow the release of air from the passages. The compartments may be connected to each other for communication with a common air discharge duct. All air discharge ducts connected to the compartments in the platform means may be connected to a common valve which may be opened to allow release of air from all compartments simultaneously to allow the platform means to be submerged. The depth to which the platform means may be submerged may be governed by floats secured to the platform means in a similar manner to that described in my aforementioned U.S. Pat. No. 5,309,893.

BRIEF DESCRIPTION OF THE DRAWINGS

In order that the invention may be more readily understood and put into practical effect, reference will now be made to the accompanying drawings which illustrate a preferred embodiment of the invention and wherein:

FIGS. 10 to 12 are sectional views along lines B—B, C—C and D—D respectively of FIG. 6.

DESCRIPTION OF THE PREFERRED EMBODIMENTS

Figure 1:
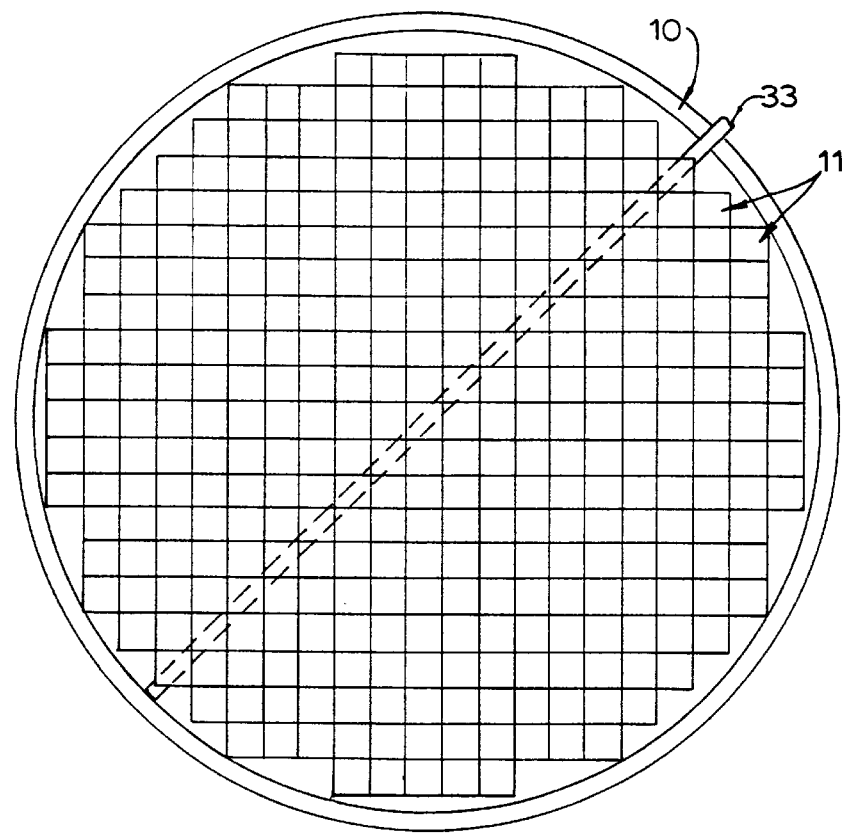
FIG. 1 is a plan view showing a typical layout of an array of solar collector assemblies incorporating floating platforms.
Figure 4:
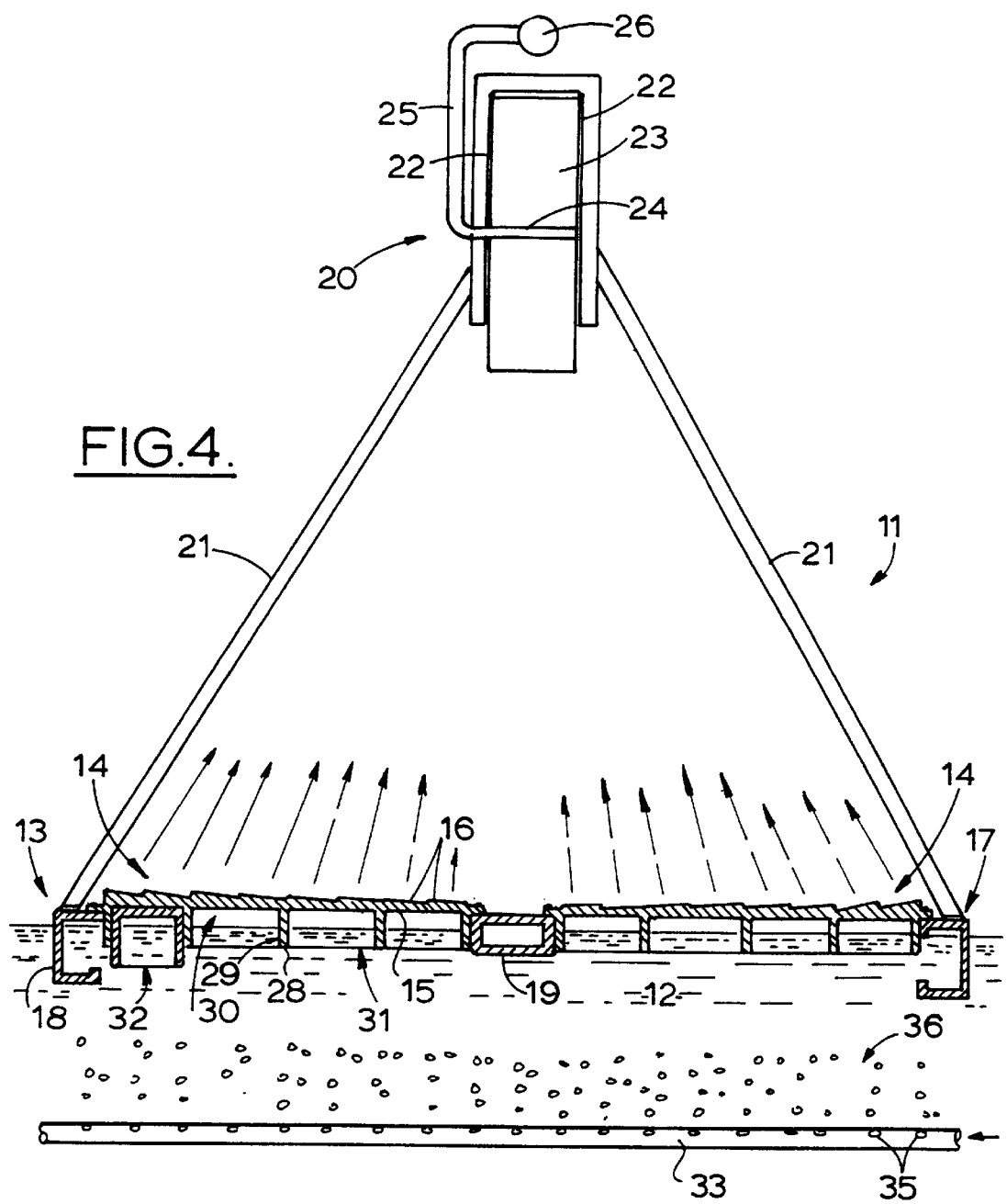
FIG. 4 is a side elevational view of a solar collector assembly using the solar concentrator of FIG. 3 showing the platform in cross section.

Referring to the drawings and firstly to FIG. 1 there is illustrated generally an array 10 of radiant energy, suitably solar, collecting assemblies 11 of the type shown more clearly in FIG. 4. The array 10 of solar collecting assemblies 11 are arranged in a generally circular configuration for flotation on a body of water or other liquid 12 which acts as a bearing so that the array 10 may be rotated about a vertical axis at the centre of the array to track movement of the sub in the manner described in my aforesaid U.S. Pat. No. 5,309,893. Of course the array 10 of solar assemblies may comprise any number of collecting assemblies 11 to suit the particular application requirements of the array 12 or energy demand.

Figure 3:
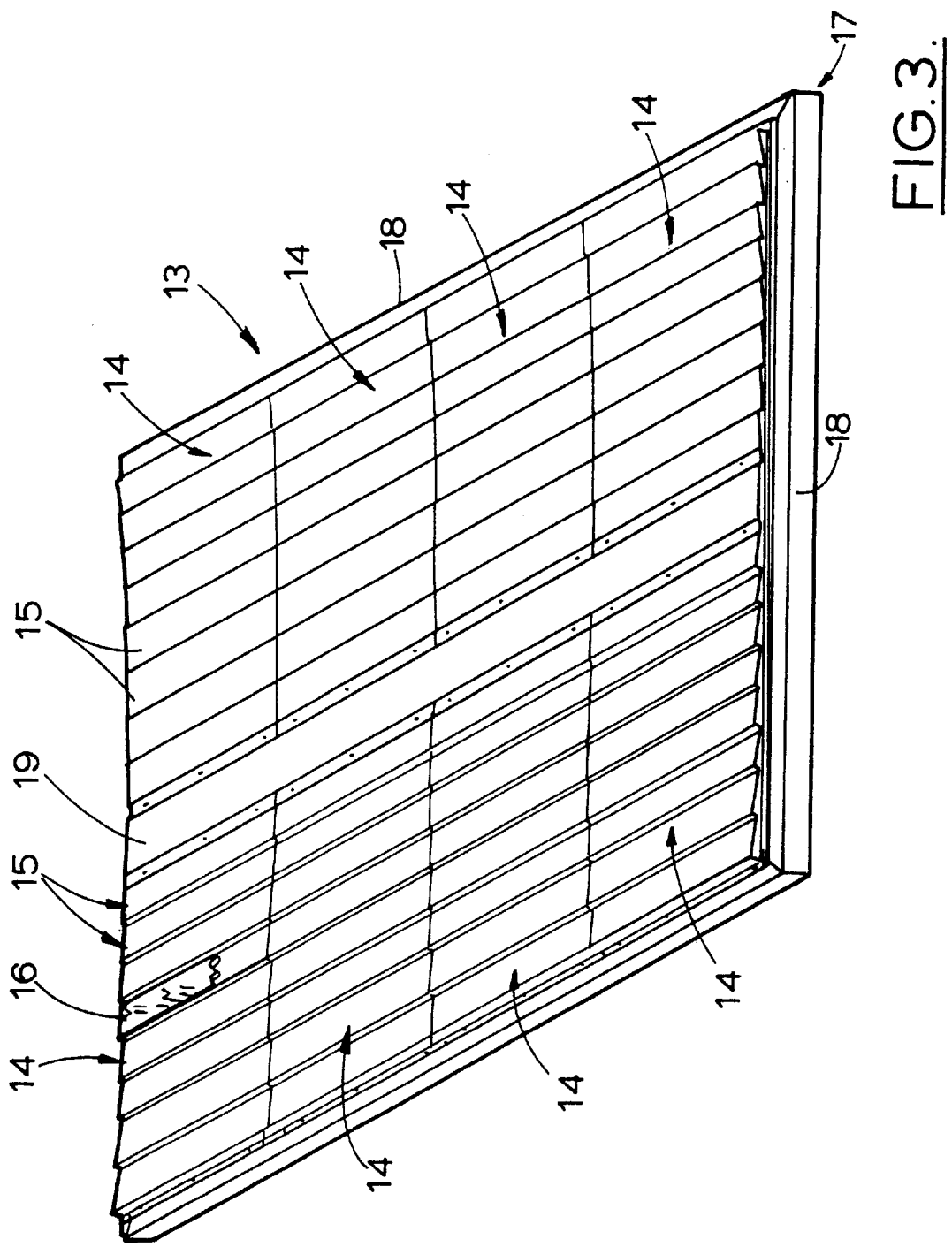
FIG. 3 is an isometric view of a set of floating platforms forming a parabolic trough for a solar concentrator for use in the array of FIGS. 1 and 2.

Each solar collecting assembly 11 as shown more clearly in FIGS. 3 and 4 includes a platform assembly 13 which is capable of floating on the body of liquid such as water 12 in the manner described further below. In this embodiment, the platform assembly 13 is formed of eight identical platforms 14, pairs of which are arranged in end-to-end relationship in two columns opposite each other. The platforms 14 are provided with or include on or in their upper sides, a plurality of angled planar surfaces 15 which define mounts for elongated strip reflectors 16 (one of which is shown cut-away in FIG. 3) which are supported thereon. The surfaces 15 are arranged at an increasing angle to the horizontal outwardly from the centre line of the platform 13 and along parabolic curves on opposite sides of the platform 13 so that the reflectors 16 form a composite primary reflector of concentrator in the form of a parabolic trough.

The platforms 14 in this embodiment are attached to a frame 17 comprising outer peripheral frame members 18 and a central frame member 19. The reflectors 16 suitably are in the form of glass or plastic strip mirrors, however, they may also be of any other highly reflective material. Each platform assembly 13 may be connected to the adjacent platform 13 at its opposite ends and sides through connector elements or assemblies into the FIG. 1 configuration, the connection elements preferably permitting when the platforms assemblies 13 are floating on water or liquid, a degree of relative movement pivotally and horizontally between the platform assemblies 13 of adjacent solar collecting assemblies 11.

The reflectors 16 are arranged to concentrate solar energy onto or towards a target 20 supported above each platform assembly 13 by means of pairs of opposite downwardly and outwardly inclined struts 21 which are mounted at their lower ends to the outer frame members 18. In FIG. 4, the target 20 comprises secondary concentrating assemblies including a pair of opposite spaced apart planar reflectors 22 which have their reflective surfaces facing and extending parallel to each other and a series of secondary concentrating cylindrical parabolic reflectors 23 which concentrate energy on an energy collecting element 24 in the form in this embodiment of a tubular pipe which carries and energy transfer medium and which is connected via a connecting duct 25 to a manifold assembly 26. Such an arrangement is disclosed in my aforesaid U.S. Pat. No. 5,592,932.

Figure 4A:
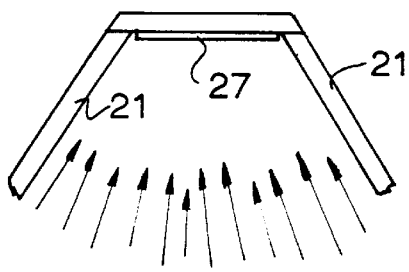
FIG. 4A illustrates an alternative target for use in the solar collector assembly of FIG. 4.

Alternatively, as in the embodiment of FIG. 4A, energy from the primary concentrating assembly is concentrated on a target 27 which may comprise pholtovoltaic cells for the generation of electrical current or any other form of energy receiving and/or converting device.

Figure 5:
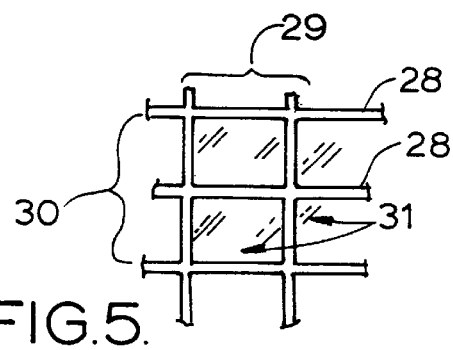
FIG. 5 is an underside view of part of the platform of FIG. 4 showing the air compartments.
Figure 6:
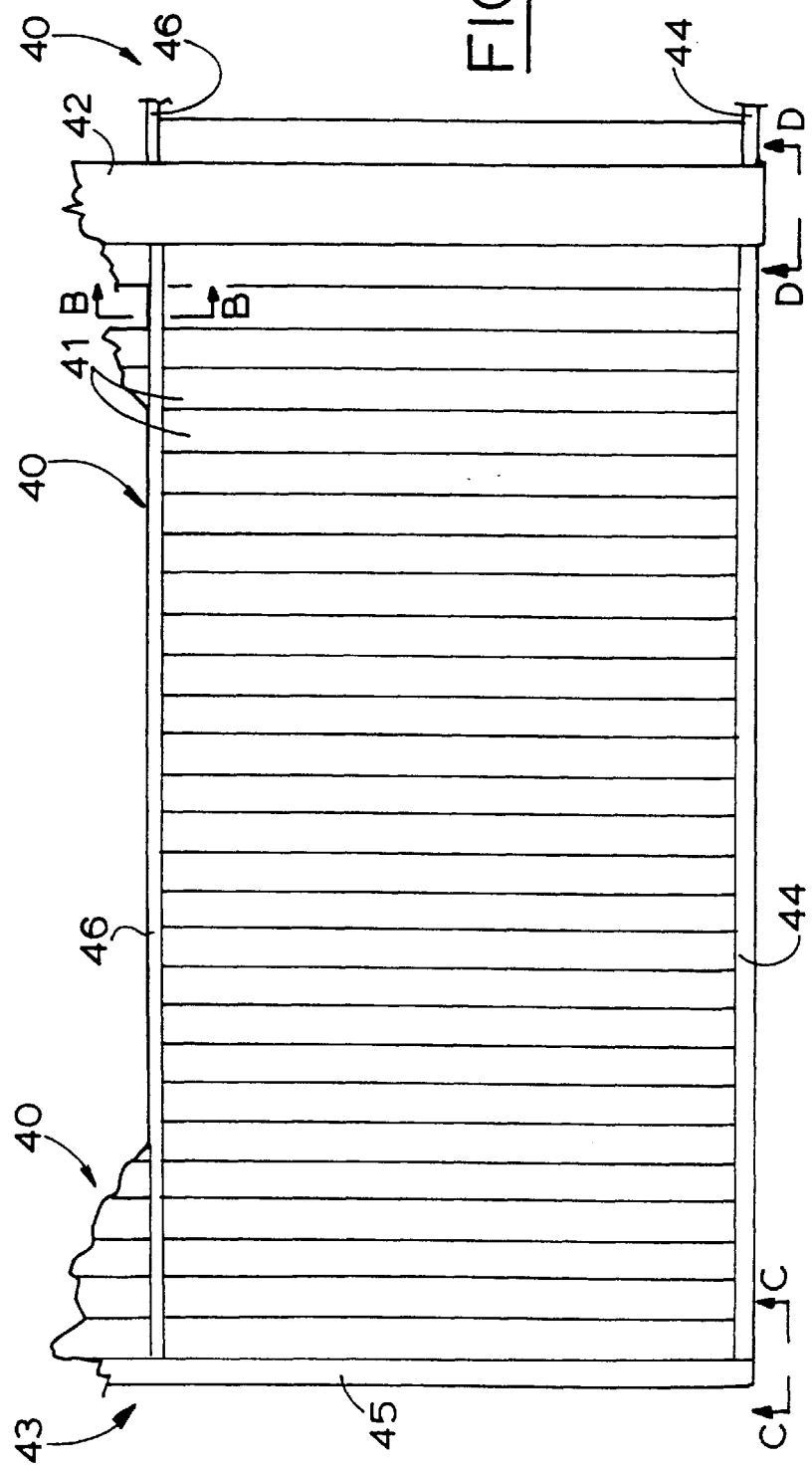
FIG. 6 illustrates in plan view, a platform and part of a supported platform frame of an alternative collector assembly.
Figure 7:
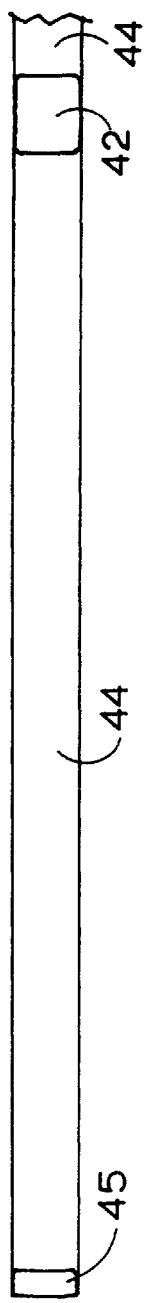
FIG. 7 is an end view of the platform frame of FIG. 6.

The platforms 14 as shown more clearly in FIGS. 4 and 5 are provided on their underside with a plurality of downwardly directed ribs 28, sets 29 of which extend substantially parallel to the surfaces 15 and further sets 30 of which extend at right angles to the surfaces 15. The intersecting sets 29 and 30 of ribs 28 define a series of compartments 31 on the underside of the platforms 14 which are closed on their sides and bases on the undersurface of the platform 14 but which are open on their lower most sides. Air may thus be readily trapped in the compartments 31 and provide buoyancy to the platforms 14 and platform assembly 13 in the manner shown in FIG. 4 so that the surfaces 15 carrying the reflectors 16 are normally located well above the level of water or liquid 12. The ribs or flanges 28 in addition to defining the compartments 31 provide stiffness to the platforms 14. If necessary or alternatively, additional hollow bodies 32 for example in the form of hollow buckets or containers, may be located within the compartments 31 and held snugly therein, the bodies 32 providing an increased volume for capture of air. Such bodies 32 may be provided in all compartments 31 or only selected compartments where for example increased buoyancy is required such as at opposite sides of the platform assembly 13.

Figure 2:
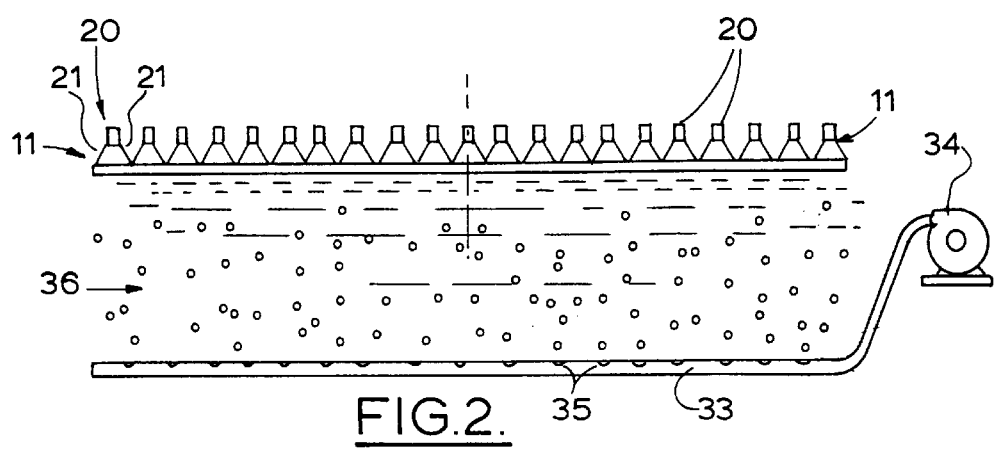
FIG. 2 is a schematic side view of the array of solar collector assemblies of FIG. 1 floating on a body of liquid.

To recharge the compartments 31 (and/or bodies 32) with air, in for example the case of loss of buoyancy in the platform assembly 13, an air supply duct 33 may be located beneath the platform assemblies 13 as shown in FIGS. 2 and 4 and connected to a suitable air supply such as a pump 34. Most preferably, the duct 33 extends generally diametrically of the array 10 as shown in FIG. 1. The duct 33 is provided with a plurality of spaced openings 35 to permit air to escape from the duct 33. Thus air supplied to the duct 33 from the pump 34 will bubble out through the openings 35 to pass upwardly in the form of bubbles 36 which upon reaching the surface level of the liquid 12, will supply air into the compartments 31. During operation, the array 10 of solar collector assemblies 11 are rotated about a central vertical axis on the body of liquid 12 to follow the sun as it rises and sets. The array 10 thus moves approximately 180° during the day. If air is supplied to the duct 33 as the platform assembly 13 is rotated to track the sun as above, all the compartments 31 in each collector assembly 11 will be exposed to the bubbles of air from the duct 33 and openings 35 with compartments being successively charged with air as they pass over the duct 33. Any overfilling of air in one compartment 31 will simply spill over into adjacent compartments 31 or over the edges of the platforms. It may only necessary to recharge the compartments weekly or monthly.

It will be appreciated that the compartments 31 on the underside of the platforms 14 may be of many different shapes by, for example, altering the configuration of the ribs or flanges 28. As an example, the sets 29 and 30 of ribs or flanges 28 may be arranged relative to each other to form compartments of diamond shape or square shape. The ribs or flanges 28 may also be provided on only part of the platforms 14.

Furthermore, in an alternative configuration, pairs of opposite platforms 14, rather than being formed separately, may be formed together in a single unit defining a parabolic trough for supporting the reflecting mirrors 16. The external frame 17 may also be in many different configurations and in some embodiments may be formed as part of the platforms 14.

FIGS. 6 to 12 illustrate an alternative embodiment of the invention similar to the above described embodiments however in this case the platforms 40 are constructed of a moldable material such as concrete. As above, the platforms 40 in this embodiment are arranged in an array of two columns and four rows with opposing platforms 40 in each row forming a composite parabolic trough. The platforms 40 are formed with a plurality of flats or surfaces 41 arranged at an increasing angle to the horizontal outwardly from a central beam 42 of a frame 43 supported in use by the floating platforms 40. The frame 43 additionally includes end frame members 44 and side frame members 45 which define the boundaries of the array of platforms 40. Intermediate frame members 46 are located between adjacent platforms 40 and extend between and are connected to the central and side frame members 42 and 45. The members 42, 45 and 46 are suitably of box section form and fabricated for example of a lightweight corrosion resistant material such as galvanised steel.

Figure 8:
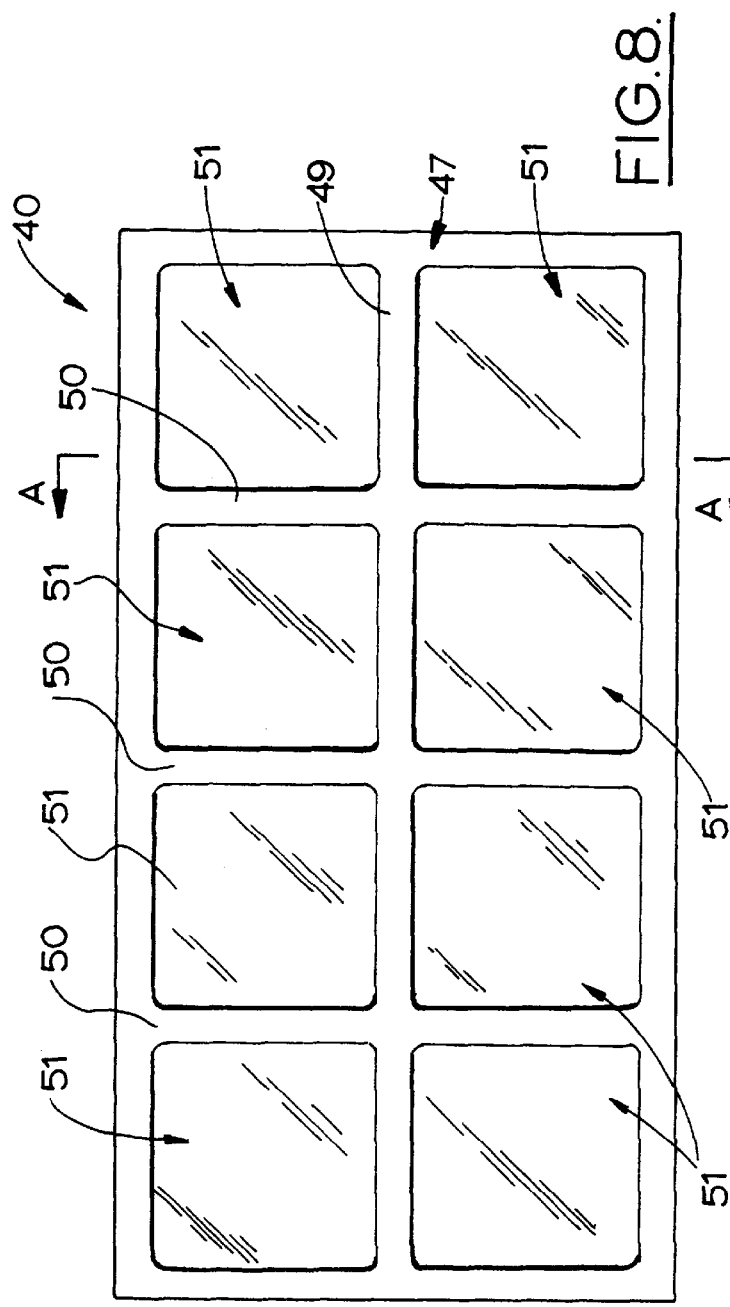
FIG. 8 illustrates from the underside, the platform used in the arrangement of FIG. 6.
Figure 9:
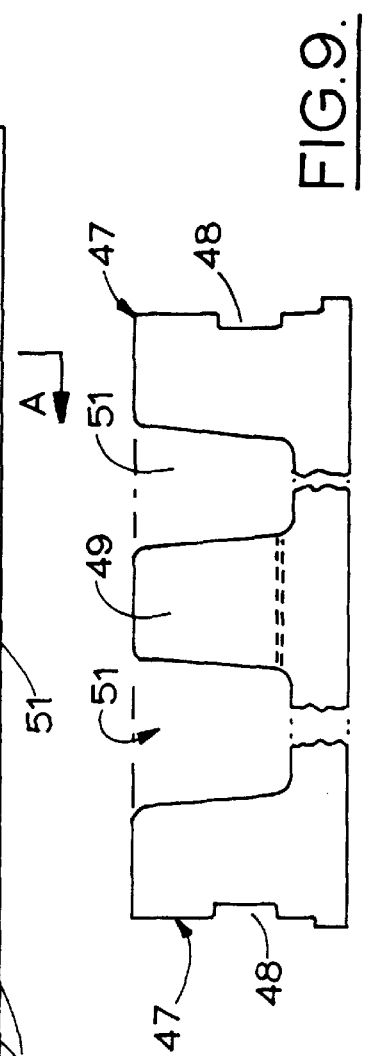
FIG. 9 is an enlarged fragmented sectional view of the body means of FIG. 8 along line A—A of FIG. 8.

Each platform 40 as shown in FIGS. 8 and 9 is of rectangular configuration and includes a downwardly extending peripheral rib 47 which is provided with a groove 48 which extends around the periphery of the platform 40 for a purpose which will hereinafter become apparent. A further rib 49 extends centrally and longitudinally of the platform 40 whilst three equally spaced ribs 50 extend transversely of the base member 40 and intersect the central rib 49, the ribs 50 being of similar cross sectional form to the ribs 49. The intersecting ribs 49 and 50 and peripheral rib 47 form in this embodiment eight recesses 51 which are open on their underside, the recesses 51 otherwise being air sealed. It will be appreciated of course that many different rib configurations may be provided on the underside of the platform 40 to form the air compartments 51.

Referring now to FIGS. 10 to 12, there are illustrated details of the connection between the frame 43 and the platforms 40. In FIG. 10 a saddle-like connection member 52 is provided over and secured to the central frame member 46, the member 52 having a pair of depending arms 53 which flare outwardly at 54 at their lower ends for locating in the grooves 48 in respective platforms 40.

At the sides of the frame 43 as shown in FIG. 11, a similar connection member 55 is provided however in this case, the member 55 comprises only one leg of the saddle-like member 52 but includes a similar depending arm 53 having a flared out portion 54 which locates within the groove 48.

At the central frame member 42, as shown in FIG. 12, connection members 55 are provided on either side of the frame member 42 with again the flared out portions of the depending arms 53 locating within the grooves 48.

The respective connection members 52 and 55 are secured to their associated frame members 46, and 44 and 42 by any suitable fastening devices. The connection members 52 and 55 suitably extend the full length of the respective frame members and are secured by spaced fasteners. The connection members 52 and 55 may be formed of a light weight resilient materials such as thin galvanized steel.

For assembly purposes, the frame 43 is assembled and may be laid on a flat surface for example a floor or ground surface. The respective platforms 40 are then aligned with the frame 43 and lowered to locate between side and/or intermediate frame members 44 and 45 and end and central frame members 45 and 42 respectively. As the platforms 40 are lowered, the respective portions 54 of the connection members 52 and 55 will be deflected inwardly until the grooves 48 are reached at which stage the portions 54 will spring outwardly to locate the grooves 48. Sides of the platforms 40 are extended at 56 to rest on the intermediate and/or side frame members 44 and 46 when the frame 43 is sitting on the ground. When floating however, the frame 43 is supported through location of the portions 54 of the connection members 52 and 55 in the grooves 48 with the lower ends sitting on shoulders 57. The frame arms 21 supporting solar energy target (see FIG. 4) may seat on the end frame members 44. Alternatively and as shown in doted outline in FIG. 11, brackets may be secured to the underside of the frame members 44 and the struts 21 secured to the brackets.

The assembled platforms 40 float on a body of liquid in the same manner as that shown in FIG. 4 with buoyancy being provided by the captured air within the chambers 51. The platforms 40 in addition support the frame 43 and via the struts 21 the target 20. Solar collector assemblies incorporating the platforms 40 may be arranged in the configuration of FIG. 1 and an air supply hose or duct 33 may be provided beneath the platforms 40 to supply air to the chambers 51 as required as described above.

Both the platform assembly 13 of FIG. 4 incorporating platforms 14 and a platform assembly incorporating the platforms 40 may be provided with means to enable the platforms 14 and 40 to be submerged in inclement weather conditions. For this purpose, means may be provided for venting air from the compartments 31 or 51. A typical arrangement is shown in FIG. 11 where a venting passage 58 extends from a compartment 51 to the exterior of the platform 40 for connection via a discharge duct 59 to a venting valve 60. Similar arrangements may be provided at each compartment 51 (or 31) or alternatively compartments 51 in each platform may be interconnected via passages through the ribs 49 ( as shown in dottled outline in FIG. 9) with one venting passage 58 for each platform 40. Further, all the discharge ducts 59 of all the platforms 14 in the whole array may be connected to each other and to a single venting valve 60. The valve 60 is normally closed to seal off the compartments 51 (or 31) however when it is desired to submerge the platforms 14 or 40 for example in the event of hail, the valve 60 may be opened permitting air to escape from the compartments 51 (or 31) until the platforms 14 or 40 are submerged below the liquid level with the reflectors 16 protected. The depth of submersion can be controlled by suitable floats located around the periphery of the platforms 14 or 40. After the inclement weather conditions have passed, air may be again supplied to the compartments 31 or 51 through the duct 33 or the compartments may be alternatively purged by air supplied through the discharge ducts 59.

Referring now to FIG. 13, there is illustrated in sectional view an alternative embodiment of platform 61 designed in this case for carrying photovoltaic cells. The platform 61 is of similar construction on its underside to the platform 40 defining air compartments 62. On its top side, the platform 61 includes a series of surfaces 63 angled to the mean declination of the sun, in this case 30°. This angle however may be varied as desired. The surfaces 63 carry photovoltaic cells 64 and the platform 61 is arranged in a floating array with other platforms 61 in a similar configuration to that shown in FIG. 1. The platforms 61 are thus rotated on liquid to follow movement of the sun during the day so that the cells 64 receive maximum exposure to the sun. As with the other embodiments, air may be supplied through the duct 33 to recharge the compartments 62 with air to maintain platform buoyancy. This may occur during rotation of the platforms 61 during the day to ensure all compartments 62 are recharged.

In an alternative arrangement for supporting the photovoltaic cells, all cells may be mounted on a planar support which may be arranged on the platform at an angle to the horizontal for example the mean angel of declination of the sun.

The platforms 61 may also incorporate a compartment venting arrangement as described with reference to FIG. 11 so as to allow the platform 61 and cells 64 carried thereby to be submerged below the liquid level to protect the cells 64 in inclement weather conditions.

Whilst the above has been given by way of illustrative embodiment of the invention, all such modifications and variations thereto as would be apparent to persons skilled in the art are deemed to fall within the broad scope and ambit of the invention as claimed.

What is claimed is:

1. Radiant energy collecting apparatus including:
  solar energy collectors,
  a platform including a top side and an underside, said platform supporting said solar energy collectors on a body of liquid, and
  compartments on said platform underside for containing air and providing buoyant lift to said platform, said compartments having an open lowermost side, and
  an air supply beneath said platform for supplying bubbles of air to said compartments through said lowermost open sides thereof.

2. Radiant energy collecting apparatus according to claim 1 wherein said compartments comprise a plurality of individual compartments.

3. Radiant energy collecting apparatus according to claim 1 wherein said compartments include separate hollow bodies attached to the underside of the platform.

4. Radiant energy collecting apparatus according to claim 2 wherein said compartments are defined by a plurality of downwardly extending ribs on the underside of said platform.

5. Radiant energy collecting apparatus according to claim 4 wherein said ribs are formed as a first series of substantially parallel ribs extending across said platform and a second series of intersecting ribs extending substantially at right angles to the first series of ribs.

6. Radiant energy collecting apparatus according to claim 2 wherein said compartments are formed integrally with said platform means.

7. Radiant energy collecting apparatus according to claim 1 wherein said platform on said top side includes solar energy concentrators.

8. Radiant energy collecting apparatus according to claim 7 wherein said solar energy concentrators include a series of mounts for reflectors, said mounts comprising respective surfaces which are angled at an increasing angle to the horizontal so that reflectors mounted thereon form a composite parabolic trough to concentrate solar energy on one or more focus lines.

9. Radiant energy collecting apparatus according to claim 8 wherein a pair of said platform are arranged adjacent but opposite to each other in end-to-end relationship to form said composite parabolic trough.

10. Radiant energy collecting apparatus according to claim 7 further comprising a frame supported by said platform for carrying a solar energy target.

11. Radiant energy collecting apparatus according to claim 10 wherein said platform has a rectangular periphery and said frame includes frame members around the periphery of said platform.

12. Radiant energy collecting apparatus according to claim 11 wherein said platform includes downwardly extending ribs around said periphery and grooves formed in said ribs defining shoulders therein, wherein connection members on said frame members extend into said grooves and are supported on said shoulders.

13. Radiant energy collecting apparatus according to claim 1 wherein said air supply comprises an air supply duct located beneath said platform and means for supplying air to said duct.

14. Radiant energy collecting apparatus according to claim 13 wherein said duct is provided with a series of spaced openings to permit escape of air therethrough.

15. Radiant solar energy collecting apparatus including:
   a solar energy collector,
   a platform having a top side and an underside, said platform for supporting said solar energy collector on a body of liquid for rotation about a vertical axis to track movement of the sun,
   compartments on the underside for containing air and providing buoyant lift to said platform means, said compartments having an open lowermost side, and
   air outlet means beneath said platform and arranged diametrically relative to the axis of rotation of said platform for supplying bubbles of air through said body of liquid to said compartments through said open lowermost ends thereof, whereby upon rotation of said platform about said vertical axis, said compartments may be charged successively with air.

16. Solar energy collecting apparatus according to claim 15 wherein said air outlets include diametrically extending air ducts beneath said platform and a plurality of openings in said air ducts.

17. Solar energy collecting apparatus according to claim 15 further comprising means for selectively venting air from said compartments for submerging said platform and said solar energy collector.

18. A method of buoyantly supporting radiant solar energy collecting apparatus on a body of liquid, said method including the steps of:
   providing a platform with an underside and having a plurality of air compartments on said platform underside for buoyantly supporting said energy collecting apparatus, said air compartments having open lowermost sides, and
   selectively supplying air to said compartments by supplying air bubbles through said body of liquid to said air compartments to maintain the buoyancy of said platform to normally maintain said collecting apparatus above the level of liquid in said body of liquid.

19. Radiant energy collecting apparatus including:
   solar energy collecting means,
   platform means for supporting said solar energy collecting means on a body of liquid, said platform means having a top side and an underside and downwardly extending peripheral ribs with grooves formed in said ribs defining shoulders therein,
   a frame supported by said platform means for carrying a solar energy target, said frame including frame members extending around the periphery of said platform means,
   connection members on said frame members extending into said grooves and supported on said shoulders,
   compartment means on the underside of said platform means for containing air and providing buoyant lift to said platform means, said compartment means having open lowermost sides, and
   means for selectively supplying bubbles of air from beneath said platform means through said body of liquid to said compartment means through said open lowermost sides.

20. Radiant energy collecting apparatus according to claim 19 wherein said platform top side includes solar energy receivers.

21. Radiant energy collecting apparatus according to claim 19 wherein said platform top side includes solar energy concentrators.

* * * * *